US011509304B2

(12) United States Patent
Wulff et al.

(10) Patent No.: US 11,509,304 B2
(45) Date of Patent: Nov. 22, 2022

(54) POWER SUPPLY CIRCUITS

(71) Applicant: Nordic Semiconductor ASA, Trondheim (NO)

(72) Inventors: Carsten Wulff, Trondheim (NO); Samuli Hallikainen, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 335 days.

(21) Appl. No.: 16/644,891

(22) PCT Filed: Sep. 6, 2018

(86) PCT No.: PCT/GB2018/052525
§ 371 (c)(1),
(2) Date: Mar. 5, 2020

(87) PCT Pub. No.: WO2019/048863
PCT Pub. Date: Mar. 14, 2019

(65) Prior Publication Data
US 2020/0266816 A1    Aug. 20, 2020

(30) Foreign Application Priority Data

Sep. 6, 2017   (GB) ..................................... 1714325

(51) Int. Cl.
*G06F 1/26* (2006.01)
*H03K 17/687* (2006.01)
(Continued)

(52) U.S. Cl.
CPC ......... *H03K 17/6871* (2013.01); *G06F 1/263* (2013.01); *G06F 1/3203* (2013.01);
(Continued)

(58) Field of Classification Search
CPC .. H03K 17/6871; H03K 17/223; G06F 1/263; G06F 1/3203; G06F 1/26; H02J 7/0031; H02M 3/156
(Continued)

(56) References Cited

U.S. PATENT DOCUMENTS 7,460,966 B1 *  12/2008  Hattori ................. H02J 7/0031
                                                               702/61
2011/0012886 A1 *  1/2011  Saether ................. H02M 3/156
                                                               345/212
(Continued)

FOREIGN PATENT DOCUMENTS

CN        106 774 777 A     5/2017
CN         106774777 A   *  5/2017  ............... G06F 1/30

OTHER PUBLICATIONS

International Search Report and Written Opinion for PCT/GB2018/052525, dated Oct. 24, 2018, 16 pages.
(Continued)

*Primary Examiner* — Ryan Jager
(74) *Attorney, Agent, or Firm* — Klarquist Sparkman, LLP

(57) ABSTRACT

A power supply circuit portion for supplying power comprises a first power rail, a second power rail, first and second output terminals, an energy storage device connected in parallel with the first and second output terminals; and first and second switching portions. The power supply circuit portion has a first mode in which power is supplied to the first and second output terminals by the first and second power rails, and a second mode in which the first switching portion is arranged such that power is not supplied to the first and second output terminals and the second switching portion is arranged to disconnect the energy storage device from the first power rail.

17 Claims, 2 Drawing Sheets

Figure 1:
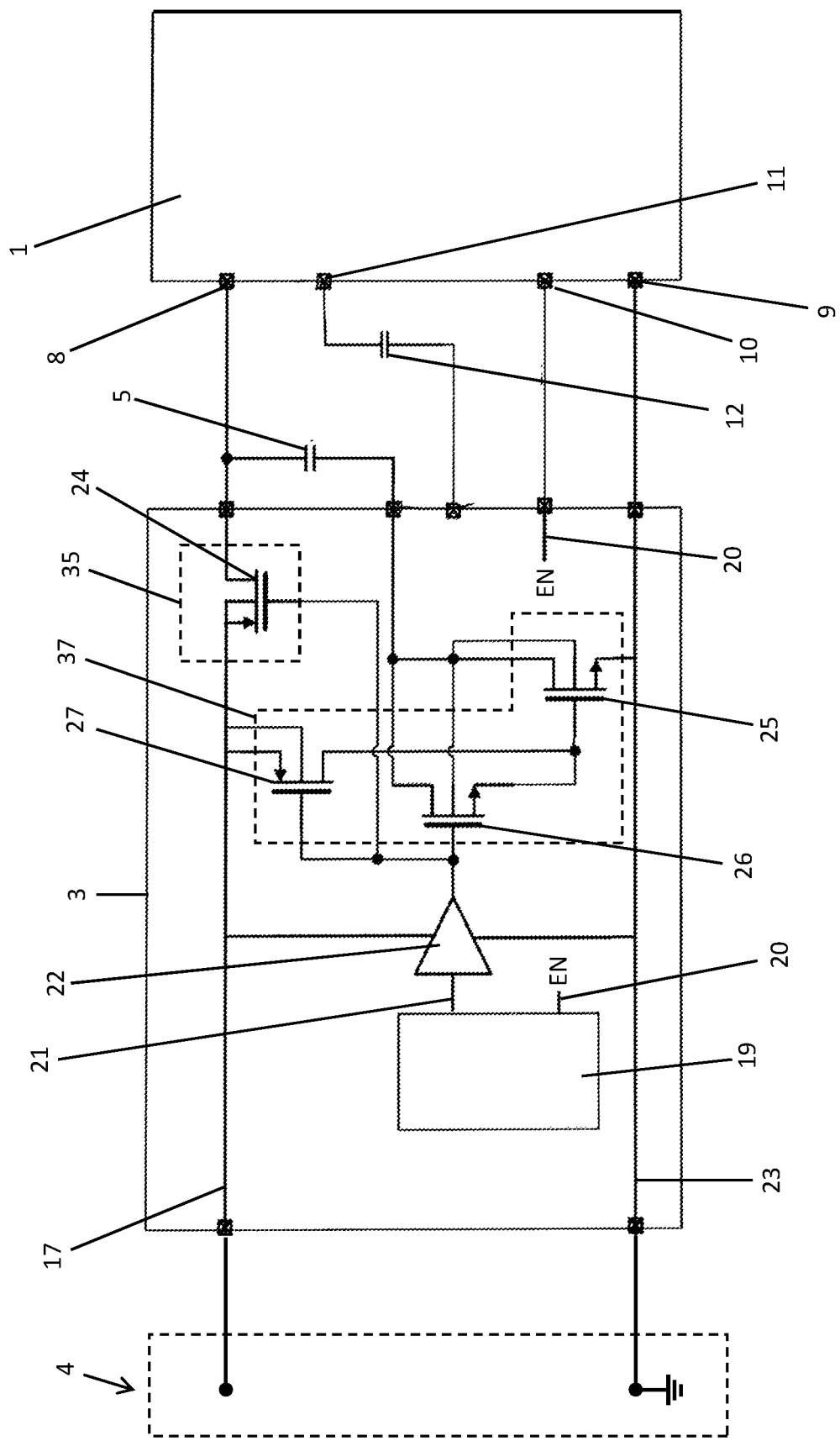

(51) Int. Cl.
*G06F 1/3203* (2019.01)
*H02J 7/00* (2006.01)
*H02M 3/156* (2006.01)
*H03K 17/22* (2006.01)

(52) U.S. Cl.
CPC ........... *H02J 7/0031* (2013.01); *H02M 3/156* (2013.01); *H03K 17/223* (2013.01)

(58) Field of Classification Search
USPC .......................................................... 323/282
See application file for complete search history.

(56) References Cited

U.S. PATENT DOCUMENTS

| | | | | |
|---|---|---|---|---|
| 2012/0235473 | A1* | 9/2012 | Jiang .................... | H02J 7/1423 307/9.1 |
| 2014/0097702 | A1* | 4/2014 | Upputuri ............ | H03K 19/0016 307/115 |
| 2014/0097884 | A1* | 4/2014 | Sofer ........................ | G06F 1/26 327/434 |

OTHER PUBLICATIONS

Search Report under Section 17(5) for Application No. GB 1714325.6, dated Mar. 2, 2018, 3 pages.

* cited by examiner

POWER SUPPLY CIRCUITS

CROSS REFERENCE TO RELATED APPLICATIONS

This is the U.S. National Stage of International Application No. PCT/GB2018/052525, filed Sep. 6, 2018, which was published in English under PCT Article 21(2), which in turn claims the benefit of Great Britain Application No. 1714325.6, filed Sep. 6, 2017.

The present invention relates to power supplies, particularly for supplying power to integrated circuits.

Integrated circuits, especially Systems on a Chip (SoCs) are commonly supplied with power by a separate power source. This power source often supplies direct current (DC) to the SoC via two input pins. In many scenarios when the SoC is powered and active, the power draw by the SoC is not constant, but can vary on very short timescales as the SoC performs different tasks. The inherent impedance of any power supply means it has a limited capacity to respond effectively to these high frequency changes in demand without a drop in voltage, which can be detrimental to the performance of the SoC or can even cause damage. A common solution to this problem is to add a "decoupling" capacitor between the power supply input pins in order to act as a charge store for supplying instantaneous charge requirements, such that transient increases in demand can be met without a drop in voltage. This decoupling capacitor also can perform a secondary role as a low pass filter that mitigates high frequency alternating current signals that may be present in the power supply reaching the SoC.

SoCs are often used in applications which do not require them to be continuously active. For example the GPS module of a smartphone may only be active when a location is requested, or a radio transmitter module may only be active when transmitting. Outside of these active periods, the SoC is not in use and as a result may enter into a low-power "sleep" state, wherein modules and circuits in the SoC are powered down in order to save energy. Ordinarily during these sleep periods the power supply is still connected to the input pins of the SoC, but the circuit does not draw any current beyond a small leakage current.

In applications where energy efficiency is of high importance however, such as in battery powered devices where long battery life is important, this small leakage current can become a dominant source of wasted energy. As such it is desirable to provide a power supply system that can reduce leakage current during sleep, whilst having little or no impact on the normal operation of the SoC.

When viewed from a first aspect, the present invention provides a power supply circuit portion for supplying power to an integrated circuit comprising:
  a first power rail;
  a second power rail;
  first and second output terminals;
  an energy storage device connected in parallel with the first and second output terminals; and
  first and second switching portions; wherein the power supply circuit portion has a first mode in which power is supplied to the first and second output terminals by the first and second power rails; and
  a second mode in which the first switching portion is arranged such that power is not supplied to the first and second output terminals, and the second switching portion is arranged to disconnect the energy storage device from the first power rail.

The invention extends to a method of supplying power to an integrated circuit using a power supply circuit portion comprising:
  first and second power rails that are selectively connectable to first and second output terminals; and
  an energy storage device that is selectively connectable in parallel with first and second output terminals;
  the method comprising:
  in a first mode, supplying power to the first and second output terminals from said first and second power rails; and
  in a second mode, not supplying power to the first and second output terminals from said first and second power rails and disconnecting the energy storage device from the first power rail.

Thus it will be appreciated by those skilled in the art that in accordance with the present invention there is provided a power supply circuit portion for supplying power that decouples the energy storage device when power is not being supplied by the output terminals. As will be explained below, this can reduce leakage current and so allows chip designers to reduce the energy usage of their end product while maintaining entirely normal operation during active states.

The power supply circuit portion may be connected to an integrated circuit so as to supply power thereto via the first and second output terminals. The invention thus extends to a system comprising:
  an integrated circuit; and
  a power supply circuit portion as described herein; wherein the power supply circuit portion is arranged to supply power to the integrated circuit via the first and second power rails.

The integrated circuit may be arranged to operate in a normal "active" state and a low power "sleep" state, in which one or more modules and/or blocks in the integrated circuit are turned off, which may reduce the current requirements of the integrated circuit.

The Applicant has appreciated that in conventional power supply arrangements the power supply is simply disconnected when the attached integrated circuit is in the low power "sleep state" (and reconnected when the sleep period is over). However this results in the energy storage device discharging via leakage through the attached integrated circuit during sleep, such that recharging is required when the integrated circuit leaves the sleep state, which uses additional energy. Whilst this may not be significant with a long enough "sleep" period, as the energy required to recharge is small compared to the energy saved, the Applicant has further realised that with shorter sleep times the additional recharge current cost can outweigh these savings, and that recharging the energy storage device also takes time, which can delay the resumption of normal operation at the start of an active period.

However by having the second switching portion arranged to disconnect the energy storage device from the first power rail in the second mode in accordance with the invention, the energy storage device can be effectively isolated in the second mode, mitigating discharging (and subsequent recharging) of the energy storage device.

The power supply circuit portion may be arranged to switch from the first mode to the second mode in response to an externally provided signal. Additionally or alternatively it may switch from the first mode to the second mode based upon an internal trigger, for example at a certain time, or based upon the magnitude of current drawn from the first and second supply terminals. In embodiments which feature the externally provided signal, this may originate from an integrated circuit to which the power supply circuit portion is supplying power. The externally provided signal may be provided from an integrated circuit which has just entered a low power "sleep" state.

In some sets of embodiments the power supply circuit portion may similarly be arranged to switch from the second mode to the first mode in response to an externally provided signal and/or in response to an internal trigger. In embodiments which feature the externally provided signal, this may originate from an integrated circuit to which the power supply circuit portion is supplying power. The externally provided signal may be provided from an integrated circuit which is in a low power "sleep" state and is about to enter a normal operating "active" state.

The power supply circuit portion may be arranged to transmit a "sleep" signal to an integrated circuit to which it is supplying power. This signal may be transmitted while the power supply circuit portion is in the first mode, and may be transmitted just before the power supply circuit portion enters the second mode. The "sleep" signal may trigger the integrated circuit to enter a low power "sleep" state.

The power supply circuit portion may be arranged to transmit an "enable" signal to an integrated circuit. This signal may be transmitted while the power supply circuit portion is in the first mode and may be transmitted just after the power supply circuit portion has switched from the second mode to the first mode. The "enable" signal may trigger the integrated circuit to enter a normal "active" state.

In some embodiments the energy storage device is a capacitor, for example a ceramic capacitor or an electrolytic capacitor, but it could also comprise any other type of capacitor known in the art, a battery, or any other suitable energy storage device. In some embodiments the energy storage device comprises a plurality of capacitors connected in parallel, which can be advantageous for filtering noise occurring at a variety of frequencies. The plurality of capacitors may comprise different types of capacitors, and/or capacitors with different capacitance values.

In preferred embodiments the power supply circuit portion is battery powered, although any suitable power source, for example a mains-powered transformer or a solar cell could be used.

In some embodiments, all of the components comprising the power supply circuit portion are provided as part of an integrated circuit, however in other embodiments one or more components are not supplied as part of the integrated circuit, for example the energy storage device may be supplied as a discrete off-chip component. This enables the energy storage device to be interchangeable between different deployments, such that different decoupling requirements of applications can be met by exchanging only the energy storage device, instead of the entire integrated power supply circuit portion. Interoperability of the power supply circuit portion can reduce production costs and times and aid compatibility. It can also be easier to implement an energy storage device with a large capacitance/capacity when it is provided off-chip.

The power supply circuit portion is intended in use to provide power to an integrated circuit, for example a System on a Chip (SoC). In such an arrangement, at least one component of the power supply circuit portion may be provided as part of the integrated circuit it supplies power to, for example the energy storage device. This can lead to space and energy savings. In other embodiments, the entire power supply circuit portion is integrated with the integrated circuit it supplies power to.

There are a number of possible ways to implement the first and second switching portions, however, at least in a set of embodiments, the first and second switching portions comprise a plurality of transistors. These may be metal-oxide-semiconductor field-effect transistors (MOSFETs), but could alternatively be any transistor technology known in the art per se, such as bipolar junction transistors (BJTs) or junction field-effect transistors (JFETs).

In a set of embodiments the first switching portion comprises a single p-channel metal-oxide-semiconductor field-effect transistor (PMOSFET). In an overlapping set of embodiments the second switching portion comprises a plurality of n-channel metal-oxide-semiconductor field-effect transistors (NMOSFETs).

The Applicant has appreciated that for embodiments wherein the first and second switching portions are implemented using transistors, there is the possibility that, during operation, large gate-source or drain-source potentials may be present on the component transistors due to, for example, floating potentials at gates following disconnection from the power rail. Large voltages such as these applied to some varieties of transistor can cause damage and/or failures and therefore in a set of embodiments there is provided at least one clamp transistor which is arranged to limit the exposure of the component transistors to large potentials by clamping the voltage on one or more of the terminals of the component transistors. The at least one clamp transistor may be arranged such that its gate terminal is connected to the first or second output terminal and/or its source terminal is connected to the first or second output terminal.

The clamp transistor may be a metal-oxide-semiconductor field-effect transistor (MOSFET), but could alternatively be any transistor technology known in the art per se, such as a bipolar junction transistor (BJT) or a junction field-effect transistors (JFET).

In some embodiments there are provided first and second clamp transistors. The first clamp transistor may have its gate terminal connected to the first output terminal. The second clamp transistor may have its drain terminal connected to the second output terminal. In some embodiments the first clamp transistor is in a source follower configuration.

The Applicant has appreciated that in some applications, a SoC can require two distinct power supply inputs operating at different voltages and that it may be advantageous to provide them with independent decoupling. Accordingly, in a set of embodiments the power supply circuit portion further comprises:

a third power rail arranged to supply power to a third output terminal when the power supply circuit portion is in the first mode;

a second energy storage device connected in parallel with the first and third output terminals; and a third switching portion, wherein the third switching portion is arranged to disconnect the second energy storage device from the first power rail when the power supply circuit portion is in the second mode.

As a result, in this set of embodiments, the power supply circuit portion can supply power at two voltages whilst providing effective independent decoupling and without any additional storage device recharge current penalty on either of the energy storage devices.

The term "disconnect", when used in relation to two electrical terminals does not necessarily require that the current flowing between the two electrical terminals is reduced completely to zero. It should instead be understood to mean that the current flowing between the electrical terminals is substantially reduced, for instance to no more than a leakage current of transistor(s).

Features of any aspect or embodiment described herein may, wherever appropriate, be applied to any other aspect or embodiment described herein. Where reference is made to different embodiments or sets of embodiments, it should be understood that these are not necessarily distinct but may overlap.

Figure 2:
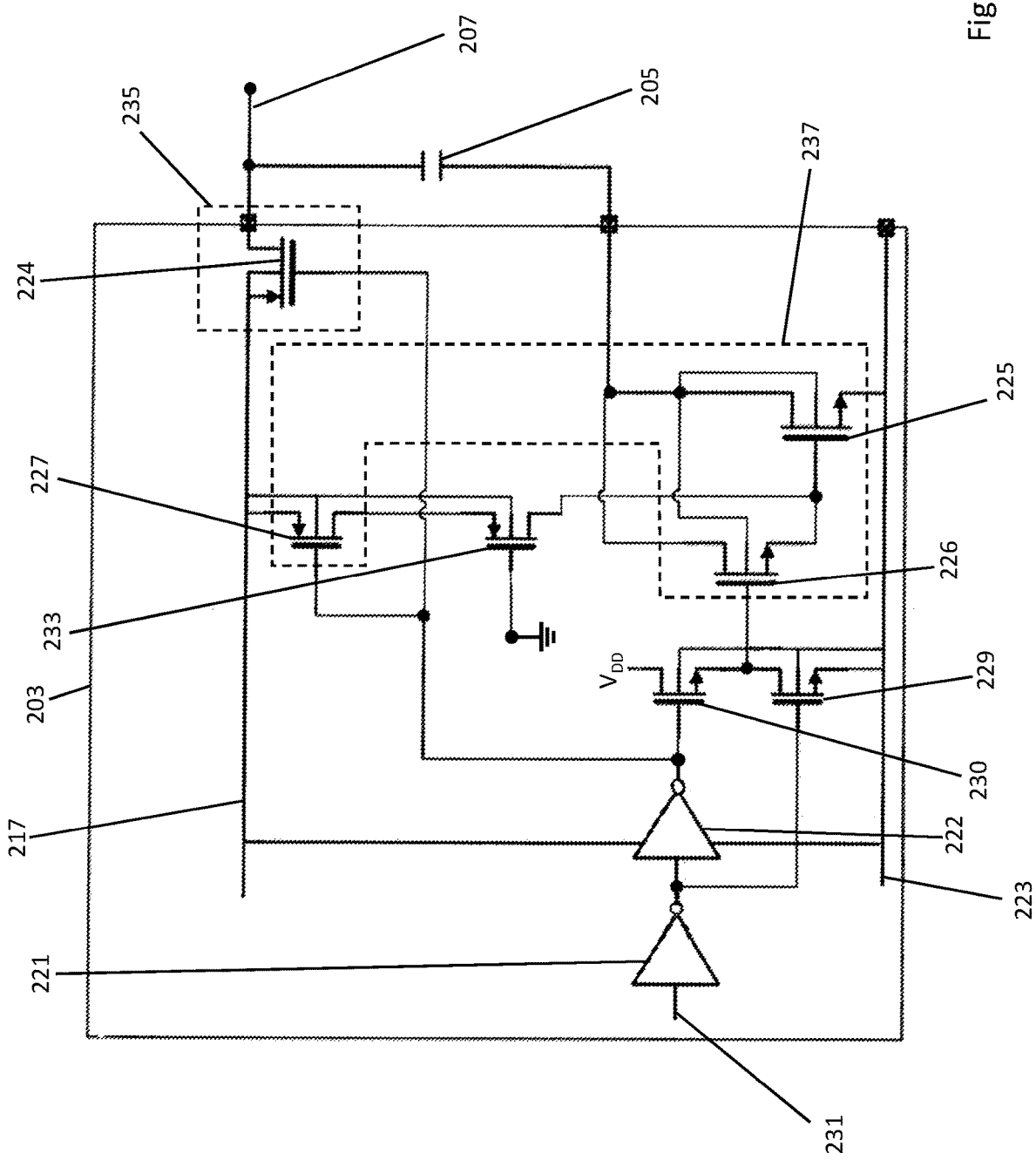

Certain embodiments of the invention will now be described, by way of example only, with reference to the accompanying drawings in which:

FIG. 1 is a schematic diagram of a circuit in accordance with an embodiment of the invention; and FIG. 2 is a schematic diagram of a circuit in accordance with a second embodiment of the invention.

FIG. 1 shows a possible arrangement for an implementation of the invention. In this example a System on Chip (SoC) 1 is connected to a Power Management Unit (PMU) 3 via a plurality of pins including a positive voltage pin 8, a ground pin 9, an enable pin 10 and a secondary input pin 11. The PMU 3 comprises a positive voltage rail 17 and a ground rail 23, which are connected to a power supply 4. In preferred embodiments the power supply 4 is a battery, although it may be any suitable source of power, for example a mains powered transformer or a solar cell. A decoupling capacitor 5 is provided between the SoC 1 and the PMU 3. The decoupling capacitor 5 is connected between the positive voltage pin 8 and is selectively connectable to ground 23 via the PMU 3 as will be explained in more detail herein below. A second decoupling capacitor 12 is also provided between the SoC 1 and the PMU 3 and is described later.

The PMU 3 further comprises a control module 19, a buffer 22, a positive control transistor 24 and first, second and third negative control transistors 25, 26, 27. The positive control transistor 24 forms a positive switching portion 35 and the first, second and third negative control transistors 25, 26, 27 form a negative switching portion 37. The positive control transistor 24 and the third negative control transistor 27 are p-channel metal-oxide-semiconductor field-effect transistors (PMOSFETs), configured with their bulk and source terminals connected to the positive voltage rail 17, such that a low signal at their gate causes them to conduct (turning them "on"), allowing current to flow between their source and drain terminals, and vice versa such that a high signal at their gate causes them to stop conducting (turning them "off"), preventing current from flowing between their source and drain terminals. The first and second negative control transistors 25, 26 are configured with their bulk and drain terminals connected to the negative plate of the decoupling capacitor 5. The first and second negative control transistors 25, 26 are n-channel metal-oxide-semiconductor field-effect transistors (NMOSFETs).

The source terminal of the positive control transistor 24 is connected to the positive voltage rail 17, and the positive voltage pin 8 of the SoC 1 is connected to its drain terminal. As will be explained in more detail below, the positive control transistor 24 can thus be operated to disconnect the positive voltage pin 8 from the positive voltage rail 17.

The first negative control transistor 25 is arranged so that its source is connected to the ground rail 23 and its gate is connected to the source of the second negative control transistor 26 along with the drain of the third negative control transistor 27. The bulk and drain terminals of the first negative control transistor 25 are connected to the negative plate of the decoupling capacitor 5 along with the bulk and drain terminals of the second negative control transistor 26.

The gates of the second and third negative control transistors 26, 27 and the positive control transistor 24 are connected to the output of the buffer 22.

The control module 19 comprises an enable signal output 20 and a control signal output 21. The enable signal output 20 is connected to the enable pin 10 of the SoC 1, and allows the control module 19 to communicate sleep and wake signals to the SoC 1. The control signal output is fed to the input of the buffer 22.

During a normal mode of operation, the output of the buffer 22 is low and so the positive control transistor 24 is on, meaning that the positive voltage pin 8 is connected to the positive voltage rail 17 such that the SoC 1 is powered, awake and active. The third negative control transistor 27 is also switched on by the low signal from the buffer 22 which pulls the gate of the first negative control transistor 25 high, switching it on. Current therefore flows from the power supply 4 through the PMU 3 into the SoC 1, with the decoupling capacitor 5 connected in parallel with the SoC 1 between the positive voltage rail 17 and the ground rail 23 via the first negative control transistor 25. The decoupling capacitor 5 acts as a low pass filter, to protect the SoC 1 from errant AC signals which might adversely affect the operation of the SoC 1. It can also act as a local charge reservoir to supply any instantaneous charge requirements of the SoC 1 i.e. to smooth out supply voltage variations resulting from fluctuating load current.

In operation, the SoC 1 enters into a sleep state, either by being sent a sleep command by the control module 19 via the enable signal output 20 or through some other external mechanism. This causes internal modules and circuits to be switched off. The control module 19 then sends a high signal from the control signal output 21 via the buffer 22, which turns the positive control transistor 24 off. This disconnects the positive voltage pin 8 from the positive rail 17, cutting the power supply to the SoC 1, such that no current can flow from the power supply 4 to the SoC 1. SoC 1 resets, and does not retain any volatile information.

As a further consequence of the high signal from the buffer 22, the second negative control transistor 26 is turned on and the third negative control transistor 27 is turned off. This means that the gate terminal of the first negative control transistor 25 is connected to the negative plate of the decoupling capacitor 5, and thus the first negative control transistor 25 is turned off. The result of this is that not only is the positive voltage pin 8 disconnected from the positive rail 17, but the decoupling capacitor 5 is disconnected from the ground rail 23, preventing the decoupling capacitor 5 from discharging.

With the SoC 1 isolated from the positive voltage rail 17, there remains a residual leakage current through the SoC 1 which pulls the positive voltage pin 8 and therefore the positive plate of capacitor 5 low. However, since the negative plate of capacitor 5 is isolated, it can float below ground and store the charge. The gate terminal of the first negative control transistor 25 is consequently held below ground by the second negative control transistor 26, ensuring that the first negative control transistor 25 is held off.

When the SoC 1 needs to wake up, the control module 19 sends a low signal from the control signal output 21 via the buffer 22 to the positive control transistor 24 and the second and third negative control transistors 26, 27. The positive control transistor 24 and the third negative control transistor 27 switch on, and the second negative control transistor 26 switches off. The positive voltage pin 8 of the SoC 1 and the positive plate of the decoupling capacitor 5 are connected to the positive voltage rail 17, and the gate of the first negative control transistor 25 is pulled high, connecting the negative plate of the decoupling capacitor 5 to the ground rail 23. The positive voltage pin 8 is immediately at operating voltage as the decoupling capacitor 5 has stored the charge and so there is no increased power load after waking to re-charge it that would have been present were the decoupling capacitor 5 not isolated during sleep. An enable signal may be sent by the control module 19 to the SoC 1 via the enable signal output 20 and the enable pin 10, in order to indicate that the supply is available and thus the modules and circuits on the SoC 1 can be powered up so that normal operation can resume.

FIG. 1 also shows a second decoupling capacitor 12, connected to the SoC 1 by a second input pin 11. Although it is not shown, the second capacitor 12 is connected to a second isolating circuit within the PMU 3, which allows it also to store charge during sleep. The required voltage for the second input pin 11 may differ from that on the positive voltage pin 8. As the second capacitor 12 has a second isolating circuit, it can store a different charge to that of the original decoupling capacitor 5, when isolated during sleep. In some embodiments there may be more than one additional decoupling capacitor and corresponding isolation circuits. This enables multiple circuits operating at different voltages on the SoC 1 to benefit from isolating decoupling capacitors.

Although it provides significant benefits over the prior art, namely that with short sleep times there are significant power savings made by not having to recharge the decoupling capacitor on wake, the Applicant has appreciated that in the embodiment illustrated in FIG. 1, in some circumstances the third negative control transistor 27 could be exposed to voltage drops between source and drain of up to two times the supply voltage. Similarly the second negative control transistor 26 could be exposed to a relatively large voltage drop between gate and source. Although these voltage drops could be handled by certain technologies, it may be desirable in some situations to limit the exposure of the control transistors 24, 25, 26, 27 to no more than the level of the positive voltage rail 17.

FIG. 2 shows an alternative embodiment of a Power Management Unit 203 (PMU) in which such a limit is obtained. In this embodiment the PMU 203 comprises a positive voltage rail 217 and a ground rail 223 which are supplied by a power supply (not shown), along with a first inverter 221 with a control input 231 and a second inverter 222, which is supplied by the output of the first inverter 221. The PMU 203 further comprises a positive control transistor 224 along with first, second and third negative control transistors 225, 226, 227 and first, second and third clamp transistors 229, 230, 233. The positive control transistor 224 forms a positive switching portion 235 and the first, second and third negative control transistors 225, 226, 227 form a negative switching portion 237.

The positive control transistor 224, the third negative control transistor 227 and the third clamp transistor 233 are configured with their bulk connected to the positive voltage rail 217, such that a low signal at their gate causes them to conduct (turning them "on"), allowing current to flow between their source and drain terminals, and vice versa such that a high signal at their gate causes them to stop conducting (turning them "off"), preventing current from flowing between their source and drain terminals. The positive control transistor 224, the third negative control transistor 227 and the third clamp transistor 233 are p-channel metal-oxide-semiconductor field-effect transistors (PMOSFETs).

The first and second negative clamp transistors 229, 230 are configured with their bulk connected to the ground rail 223, such that a low signal turns them off, and a high signal turns them on. The first and second negative control transistors 225, 226 are configured with their bulk connected to the negative plate of the capacitor 205. The first and second negative control transistors 225, 226 and the first and second clamp transistors 229, 230 are n-channel MOSFETs (NMOSFETs).

The source terminals of the positive control transistor 224 and the third negative control transistor 227 are connected to the positive voltage rail 217, and their gate terminals are connected to an output of the second inverter 222. The positive control transistor 224 has its drain connected to a positive voltage supply line 207, and the third negative control transistor 227 has its drain connected to the source of the third clamp transistor 233. The third clamp transistor 233 has its gate connected to ground, and its drain terminal is connected to the gate of the first negative control transistor 225.

The first clamp transistor 229 has its gate terminal also connected to output of the first inverter 221, and its source is connected to the ground rail 223. The second clamp transistor 230 has its gate connected to the output of the second inverter 222 and its drain connected to the positive voltage supply line 207. The source of the second clamp transistor 230 is connected to the drain of the first clamp transistor 229, and to the gate of the second negative control transistor 226.

The second negative control transistor 226 has its source connected to the gate of the first negative control transistor 225, and its drain connected to the negative plate of the decoupling capacitor 205. The first negative control transistor 225 is also configured to have its drain terminal connected to the negative plate of the decoupling capacitor 205 and its source terminal connected to the ground rail 223.

In a similar manner to the first embodiment, the PMU 203 controls the connection of the positive voltage rail 217 to the positive voltage supply line 207 of a System on a Chip (SoC, not shown), along with being operable to isolate a decoupling capacitor 205 from both the positive voltage rail 217 and the ground rail 223. The details of this operation are detailed below.

During normal operation, the PMU 203 supplies power to the SoC via positive voltage supply line 207. A low signal is provided from the control input 231 to the first inverter 221. The inverted signal is sent to the second inverter 222 as well to the gate of the first negative clamp transistor 229, causing it to conduct. The second inverter 222 pulls the gates of the positive control transistor 224 and the third negative control transistor 227 low, causing them to conduct, and also pulls the gate of the second clamp transistor 230 low, causing it to stop conducting. The positive control transistor 224 and the third negative control transistor 227 are consequently on and connect the positive voltage rail 217 to the positive voltage supply line 207 and to the source terminal of the third clamp transistor 233 respectively.

As the first clamp transistor 229 is conducting, it connects the gate terminal of the second negative control transistor 226 to the ground rail 223, causing it to stop conducting. As the gate of the third clamp transistor 233 is connected to ground, it conducts and so connects the gate terminal of the first negative control transistor 225 to the positive voltage rail 217 and consequently the negative plate of the decoupling capacitor 205 is connected to the ground rail 223 via the source and drain of the first negative control transistor 225.

When a sleep event occurs, a high signal is sent from the control input 231 to the first inverter 221, the output of which is sent to the second inverter 222 as well to the gate of the first clamp transistor 229, switching it off. The output of the second inverter 222 provides a high signal to the gate terminals of the positive control transistor 224 and the third negative control transistor 227, switching them off, and also to the gate of the second clamp transistor 230, switching it on. The drain terminals of the third negative control transistor 227 and the third clamp transistor 233 are then free to float.

The high signal sent to the second clamp transistor 230 causes it to conduct such that its source terminal is connected to the positive voltage supply line 207. Instantaneously the voltage of positive voltage supply line 207 is equal to the positive rail voltage and therefore the gate voltage of the second negative control transistor 226 is high, causing it to conduct, and therefore connect the negative plate of the decoupling capacitor 205 to the gate of the first negative control transistor 225. The low signal originating from the negative plate of the decoupling capacitor 205 switches the first negative control transistor 225 off, allowing the negative plate voltage to float.

As in the first embodiment, following the disconnection of the SoC from the positive voltage rail 217, there remains a leakage current through the SoC. This causes the voltage on the positive voltage supply line 207 (and therefore the positive plate of the capacitor) to fall to around a threshold voltage $V_{TH\_SOC}$ of the component transistors in the SoC, and this in turn causes the negative plate of the decoupling capacitor 205 to float below ground (it is able to do so now that the first negative control transistor 225 is off) to maintain the charge. As the positive voltage supply line 207 and the negative plate voltage drop (in synchronisation), the gate and bulk voltages of the second negative control transistor 226 correspondingly drop, such that the second negative control transistor 226 continues to conduct. The gate voltage of the first negative control transistor 225 is consequently held below ground, ensuring that the decoupling capacitor 205 is isolated from the ground rail 223.

The drain of the third clamp transistor 233 drops to the same voltage as the negative plate of the decoupling capacitor 205. The third clamp transistor 233 is acting as a source follower and therefore the voltage at the source terminal of the third clamp transistor 233 does not fall below a positive value which mirrors the magnitude of the (negative) threshold voltage of the third clamp transistor 233. This ensures that the third negative control transistor 227 is not exposed to a large source-drain potential. In fact the magnitude of the source-drain potential of the third negative control transistor 227 never exceeds a value which is equal to the supply voltage less the magnitude of the threshold voltage of the positive clamp transistor 233.

As with the first embodiment, the decoupling capacitor 205 is isolated during sleep events, such that when a subsequent wake up occurs there is no need to re-charge the decoupling capacitor 205. In this embodiment however, this isolation is achieved with none of the component transistors being exposed to a potential exceeding the magnitude of the positive voltage rail 217.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. A power supply circuit portion for supplying power to an integrated circuit comprising:
   a first power rail;
   a second power rail;
   first and second output terminals;
   an energy storage device connected in parallel with the first and second output terminals;
   first and second switching portions comprising a plurality of transistors; and
   at least one clamp transistor arranged to limit exposure of at least one of the plurality of transistors to large potentials by clamping a voltage on one or more terminals of said at least one of the plurality of transistors;
   wherein the power supply circuit portion has a first mode in which power is supplied to the first and second output terminals by the first and second power rails; and
   a second mode in which the first switching portion is arranged such that power is not supplied to the first and second output terminals, and the second switching portion is arranged to disconnect the energy storage device from the first power rail.

2. The power supply circuit portion as claimed in claim 1, arranged to switch from the first mode to the second mode in response to an externally provided mode signal.

3. The power supply circuit portion as claimed in claim 1, arranged to switch from the second mode to the first mode in response to an externally provided mode signal.

4. The power supply circuit portion as claimed in claim 1, wherein the energy storage device comprises a decoupling capacitor.

5. The power supply circuit portion as claimed in claim 4, wherein the energy storage device comprises a plurality of decoupling capacitors connected in parallel.

6. The power supply circuit portion as claimed in claim 1, wherein the power supply circuit portion is battery powered.

7. The power supply circuit portion as claimed in claim 1, wherein at least some of the components comprising the power supply circuit portion are provided as part of an integrated circuit, and the energy storage device is provided separately from said integrated circuit.

8. The power supply circuit portion as claimed in claim 1, wherein the first switching portion comprises a single p-channel metal-oxide-semiconductor field-effect transistor.

9. The power supply circuit portion as claimed in claim 1, wherein the second switching portion comprises a plurality of n-channel metal-oxide-semiconductor field-effect transistors.

10. The power supply circuit portion as claimed in claim 1, comprising first and second clamp transistors.

11. The power supply circuit portion as claimed in claim 10, wherein the first clamp transistor is in a source follower configuration.

12. The power supply circuit portion as claimed in claim 1, further comprising:
   a third power rail arranged to supply power to a third output terminal when the power supply circuit portion is in the first mode;
   a second energy storage device connected in parallel with the first and third output terminals; and
   a third switching portion, wherein the third switching portion is arranged to disconnect the second energy storage device from the first power rail when the power supply circuit portion is in the second mode.

13. A system comprising:
an integrated circuit; and
the power supply circuit portion as claimed in claim 1;
wherein the power supply circuit portion is arranged to supply power to the integrated circuit via the first and second power rails.

14. The system as claimed in claim 13, wherein the integrated circuit is arranged to operate in an active state and a sleep state, and the integrated circuit is arranged to switch between said active and sleep states in response to a state signal provided by the power supply circuit portion.

15. The system as claimed in claim 13, wherein the integrated circuit is configured to provide an or the externally provided mode signal.

16. The system as claimed in claim 13, wherein the integrated circuit comprises a system on a chip.

17. A method of supplying power to an integrated circuit using a power supply circuit portion comprising:
first and second power rails that are selectively connectable to first and second output terminals;
first and second switching portions comprising a plurality of transistors;
at least one clamp transistor arranged to limit exposure of at least one of the plurality of transistors to large potentials by clamping a voltage on one or more terminals of said at least one of the plurality of transistors; and
an energy storage device that is selectively connectable in parallel with first and second output terminals;
the method comprising:
in a first mode, supplying power to the first and second output terminals from said first and second power rails; and
in a second mode, controlling the first switching portion so as to not supply power to the first and second output terminals from said first and second power rails and controlling the second switching portion to disconnect the energy storage device from the first power rail.

\* \* \* \* \*

UNITED STATES PATENT AND TRADEMARK OFFICE
CERTIFICATE OF CORRECTION

PATENT NO. : 11,509,304 B2
APPLICATION NO. : 16/644891
DATED : November 22, 2022
INVENTOR(S) : Wulff et al.

Page 1 of 1

It is certified that error appears in the above-identified patent and that said Letters Patent is hereby corrected as shown below:

In the Claims

Column 11,
Line 13, "to provide an or the externally provided" should be --to provide an externally provided--.

Signed and Sealed this
First Day of August, 2023

Katherine Kelly Vidal
*Director of the United States Patent and Trademark Office*